United States Patent
Mason et al.

(10) Patent No.: US 7,600,210 B1
(45) Date of Patent: Oct. 6, 2009

(54) METHOD AND APPARATUS FOR MODULAR CIRCUIT DESIGN FOR A PROGRAMMABLE LOGIC DEVICE

(75) Inventors: Jeffrey M. Mason, Eldorado Springs, CO (US); Jay T. Young, Louisville, CO (US)

(73) Assignee: Xilinx, Inc., San Jose, CA (US)

( * ) Notice: Subject to any disclaimer, the term of this patent is extended or adjusted under 35 U.S.C. 154(b) by 229 days.

(21) Appl. No.: 11/238,433

(22) Filed: Sep. 28, 2005

(51) Int. Cl.
*G06F 17/50* (2006.01)
*H03K 17/693* (2006.01)

(52) U.S. Cl. .................................. 716/16
(58) Field of Classification Search ............ 716/16
See application file for complete search history.

(56) References Cited

U.S. PATENT DOCUMENTS 6,678,646 B1 * 1/2004 McConnell et al. ........... 703/22
6,817,005 B2 11/2004 Mason et al.
2004/0049672 A1 * 3/2004 Nollet et al. ................ 713/100

OTHER PUBLICATIONS

Dutt et al., "Efficient Incremental Rerouting for Fault Reconfiguration in Field Programmable Gate Arrays", Proceedings of the 1999 IEEE/ACM international conference on Computer-aided design, pp. 173-177.*
U.S. Appl. No. 11/225,248, filed Sep. 12, 2005, Young.
U.S. Appl. No. 11/218,415, filed Sep. 1, 2005, Trimberger.
Horta, Edson L., "Automated Method To Generate Bitstream Intellectual Property Cores for Virtex FPGAs", FPL 2004, pp. 1-4, Department of Electronic Engineering, Laboratory of Integrated Systems, EPUSP, available at http://www.arl.wustl.edu/~lockwood/publications/PARBIT_FPL_04.pdf.
U.S. Appl. No. 11/225,248, filed Sep. 12, 2005, Young, Jay T., entitled "Design Methodology to Support Relocatable Bit Streams for Dynamic Partial Reconfiguration of FPGAs to Reduce Bit Stream Memory Requirements", Xilinx, Inc. 2100 Logic Drive, San Jose, California, 95124.

* cited by examiner

*Primary Examiner*—Jack Chiang
*Assistant Examiner*—Aric Lin
(74) *Attorney, Agent, or Firm*—Robert M. Brush

(57) ABSTRACT

Method, apparatus, and computer readable medium for modular circuit design for a programmable logic device (PLD) is described. In one example, a circuit design is captured. The circuit design includes a plurality of modules and one or more logic interface macros positioned on a floorplan. Each of the plurality of modules is one of a static module or a reconfigurable module. The one or more logic interface macros include programmable logic of the PLD and are positioned at one or more boundaries between one or more pairs of the plurality of modules. Each of the plurality of modules is implemented using information generated from the capturing step. The modules are assembled using the information generated from the capturing step and implementing step. Routing for a static module can cross a defined implementation area for a reconfigurable module, and a static module can be placed anywhere outside of reconfigurable module areas.

18 Claims, 7 Drawing Sheets

600

US 7,600,210 B1

METHOD AND APPARATUS FOR MODULAR CIRCUIT DESIGN FOR A PROGRAMMABLE LOGIC DEVICE

FIELD OF THE INVENTION

One or more aspects of the present invention relate generally to integrated circuit design and, more particularly, to a method and apparatus for modular circuit design for a programmable logic device.

BACKGROUND OF THE INVENTION

Programmable logic devices (PLDS) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (known as a bitstream) into internal configuration memory cells that define how the CLBs, IOBs, and interconnect structure are configured. An FPGA may also include various dedicated logic circuits, such as memories, microprocessors, digital clock managers (DCMs), and input/output (I/O) transceivers.

Presently, a final logic design (referenced herein as the top-level design) for a PLD may include many logic pieces (referenced herein as modules). All of the logic pieces may be implemented at one time to form a full implementation for the target PLD. Alternatively, each module may be designed and implemented separately. Implemented modules are then combined to form a full implementation for the target PLD. Some PLDs are configured to support dynamic reconfiguration while active. That is, some PLDs have the ability to reprogram a portion of the PLD while the rest of the PLD continues to operate normally. Since a portion of the device may be reconfigured while the device is active, some type of predefined macros or other entity must be used as interfaces to the reconfigurable modules. One such instantiation of this implementation uses three-state buffer (tbuf) macros as the interfaces of the reconfigurable modules. During reconfiguration, the tbuf macros allow a given module to be isolated from the portion of the design that is not being reconfigured. However, tbufs are typically a scarce resource in PLDs, which may restrict the number of reconfigurable modules that may be instantiated in any given design. Moreover, tbuf macros can only handle a fixed number of signals, which restricts the design of the interface of a given reconfigurable module. Accordingly, there exists a need in the art for an improved method and apparatus for modular design in a PLD.

SUMMARY OF THE INVENTION

Method, apparatus, and computer readable medium for modular circuit design to support dynamic reconfiguration for a programmable logic device (PLD) is described. In one embodiment, a circuit design is captured. The circuit design includes a plurality of modules and one or more logic interface macros positioned on a floorplan. Each of the plurality of modules is one of a static module or a reconfigurable module. The one or more logic interface macros include programmable logic of the PLD and are positioned at one or more boundaries between one or more pairs of the plurality of modules. Each of the plurality of modules is implemented using information generated from the capturing step. The modules are assembled using the information generated from the capturing step and information generated from the implementing step. Each reconfigurable module is implemented such that a new "version" of the logic using the interface of the reconfigurable module can be used to dynamically reconfigure that portion of the PLD.

BRIEF DESCRIPTION OF THE DRAWINGS

Accompanying drawing(s) show exemplary embodiment (s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
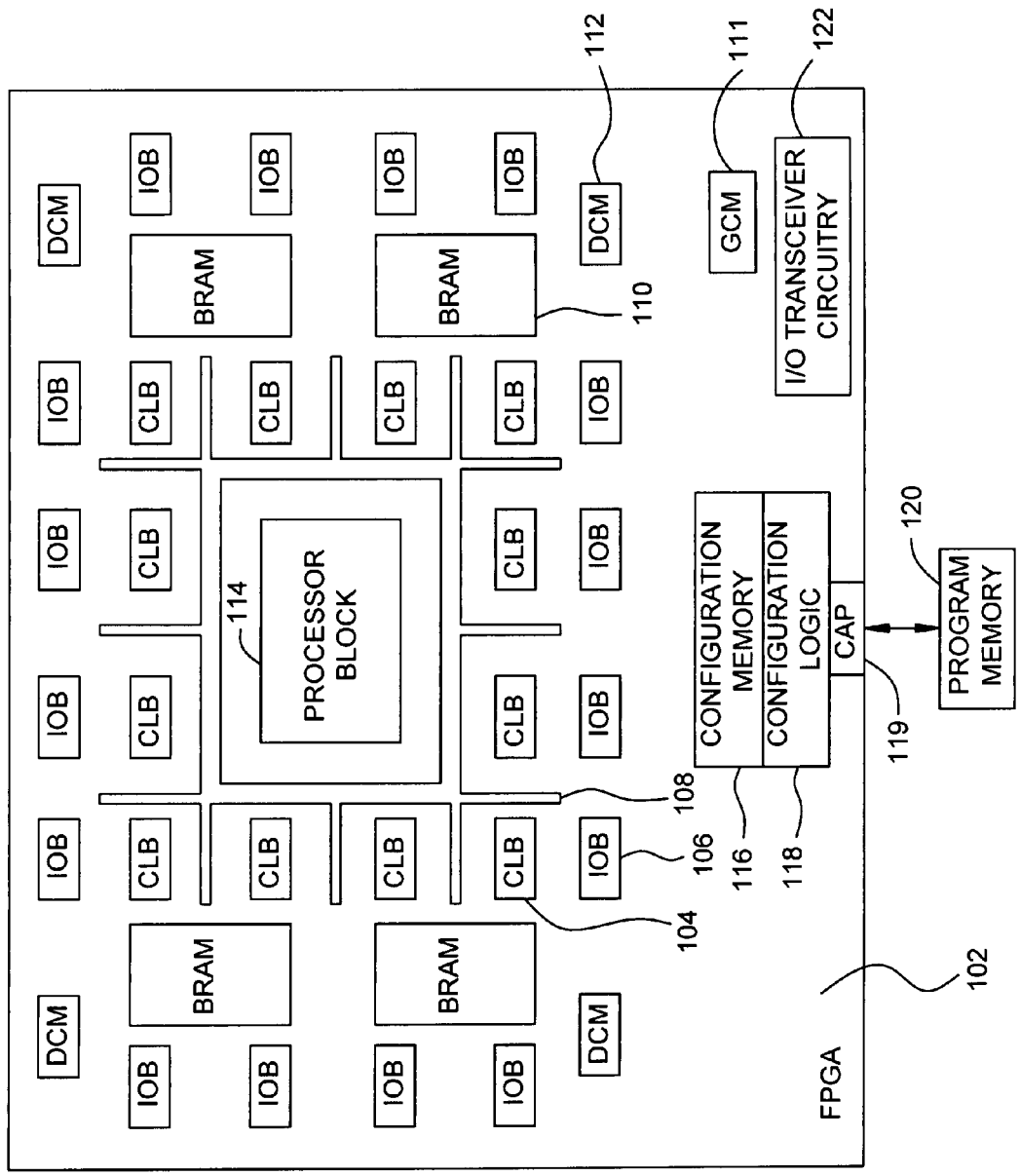
FIG. 1 is a block diagram depicting an exemplary embodiment of an FPGA coupled to a program memory.

FIG. 1 is a block diagram depicting an exemplary embodiment of an FPGA 102 coupled to a program memory 120. The FPGA 102 illustratively comprises programmable logic circuits or "blocks", illustratively shown as CLBs 104, IOBs 106, and programmable interconnect 108 (also collectively referred to as "programmable logic"), as well as configuration memory 116 for determining the functionality of the FPGA 102. The FPGA 102 may also include an embedded processor block 114, as well as various dedicated internal logic circuits, illustratively shown as blocks of random access memory ("BRAM 110"), configuration logic 118, digital clock management (DCM) blocks 112, global clock manager (GCM) blocks 111, and input/output (I/O) transceiver circuitry 122. Those skilled in the art will appreciate that the FPGA 102 may include other types of logic blocks and circuits in addition to those described herein.

As is well known in the art, the IOBs 106, the CLBs 104, and the programmable interconnect 108 may be configured to perform a variety of functions. Notably, the CLBs 104 are programmably connectable to each other, and to the IOBs 106, via the programmable interconnect 108. Each of the CLBs 104 may include one or more "slices" and programmable interconnect circuitry (not shown). Each CLB slice in turn includes various circuits, such as flip-flops, function generators (e.g., a look-up tables (LUTs)), logic gates, memory, and like type well-known circuits. The IOBs 106 are configured to provide input to, and receive output from, the CLBs 104.

Configuration information for the CLBs 104, the IOBs 106, and the programmable interconnect 108 is stored in the configuration memory 116. The configuration memory 116 may include static random access memory (SRAM) cells. The configuration logic 118 provides an interface to, and loads configuration data to, the configuration memory 116. A stream of configuration data ("configuration bitstream") produced from the program memory 120 may be coupled to the configuration logic 118 through a configuration port 119. The configuration process of FPGA 102 is also well known in the art.

The GCM blocks 111 and the DCM blocks 112 provide well-known clock management circuits for managing clock signals within the FPGA 102, such as delay lock loop (DLL) circuits and multiply/divide/de-skew clock circuits. The processor block 114 comprises a microprocessor core, as well as associated control logic. Notably, such a microprocessor core may include embedded hardware or embedded firmware or a combination thereof for a "hard" or "soft" microprocessor. A soft microprocessor may be implemented using the programmable logic of the FPGA 102 (e.g., CLBs 104, IOBs 106). For example, a MICROBLAZE soft microprocessor, available from Xilinx of San Jose, Calif., may be employed. A hard microprocessor may be implemented using an IBM POWER PC, Intel PENTIUM, AMD ATHLON, or like type processor core known in the art.

The processor block 114 is coupled to the programmable logic of the FPGA 102 in a well known manner. For purposes of clarity by example, the FPGA 102 is illustrated with 12 CLBs, 16 IOBs, 4 BRAMs, 4 DCMs, and one processor block. Those skilled in the art will appreciate that actual FPGAs may include one or more of such components in any number of different ratios. For example, the FPGA 102 may be selected from the VIRTEX-II PRO family of products, commercially available from Xilinx, Inc. of San Jose, Calif.

Figure 2:
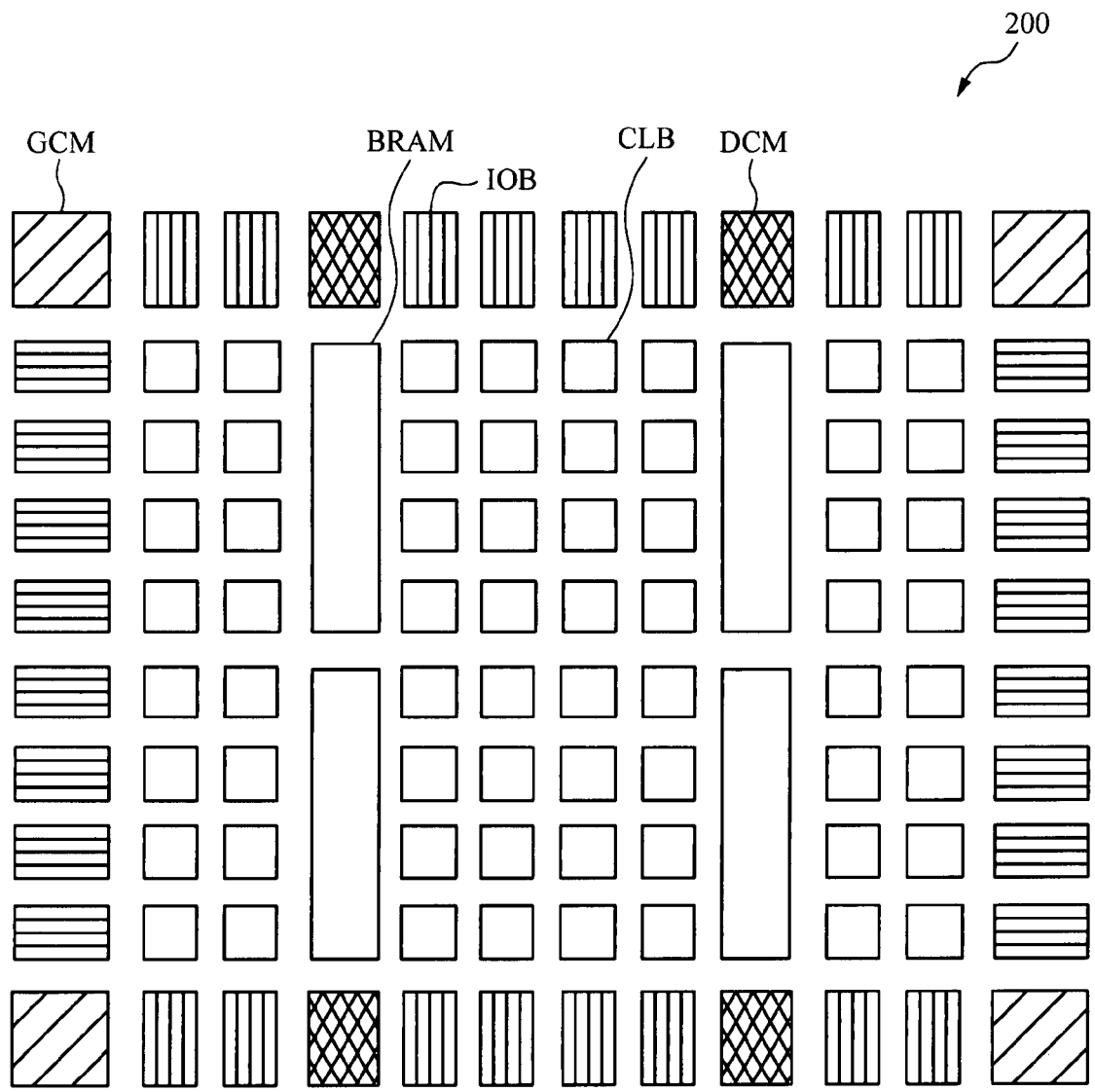
FIG. 2 is a block diagram depicting a portion of a floorplan of the FPGA of FIG. 1.

FIG. 2 is a block diagram depicting a portion 200 of a floorplan of the FPGA 102 of FIG. 1. In the portion 200, the CLBs 104, IOBs 106, and BRAMs 110 are arranged into columns to facilitate configuration. For convenience, interconnect resources are considered part of the CLB columns and are therefore not shown in FIG. 2. In the present example, each column of CLBs 104 includes one of the IOBs 106 at each of its upper and lower ends. Columns of the IOBs 106 are located at the left and right sides of the CLB array. Each column of IOBs 106 includes one of the GCMs 111 at each of its upper and lower ends. The portion 200 also illustratively includes columns of BRAMs 110, each of which includes one of the DCMs 112 at each of its upper and lower ends. Configuration memory cells of the configuration memory 116 are arranged in vertical frames that extend the length (top to bottom) of the CLB, IOB, and BRAM columns. The FPGA 102 is configured on a frame-by-frame basis. Those skilled in the art will appreciate that the floorplan of FIG. 2 is merely illustrative. The floorplan of a typical FPGA includes many more columns of CLBs and may include a processor block, as well as other types of dedicated circuitry discussed above.

Figure 3:
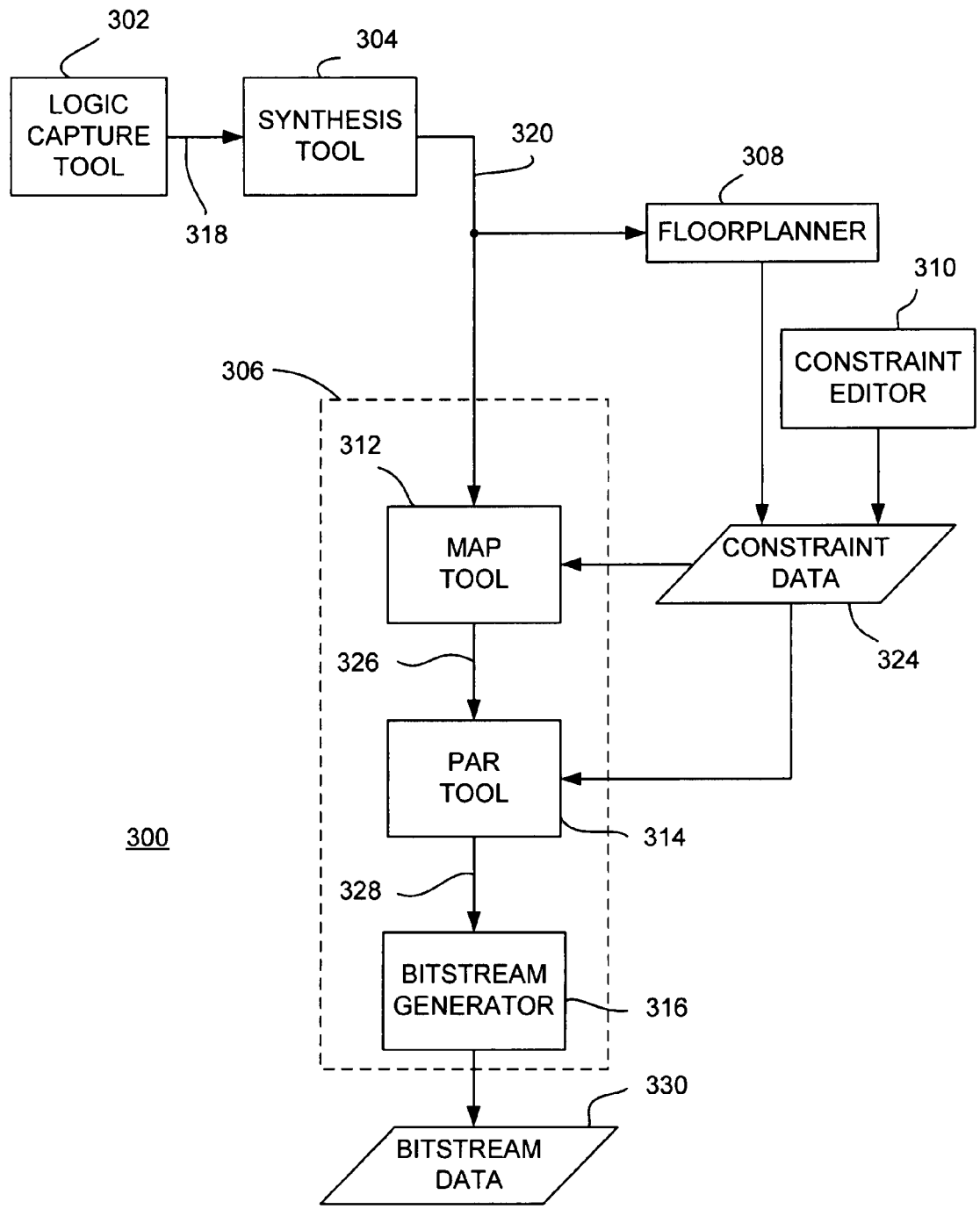
FIG. 3 is a block diagram depicting an exemplary embodiment of a logic design system for a programmable logic device (PLD) in accordance with one or more aspects of the invention.

FIG. 3 is a block diagram depicting an exemplary embodiment of a logic design system 300 for a programmable logic device (PLD) in accordance with one or more aspects of the invention. The system 300 includes a logic capture tool 302, a synthesis tool 304, a floorplanner 308, a constraint editor 310, and an implementation tool 306. In the present embodiment, the system 300 is configured to implement a logic design using a target FPGA. Accordingly, the implementation tool 306 includes a map tool 312, a place-and-route (PAR) tool 314, and a bitstream generator 316. The system 300 may be implemented using the computer 700 of FIG. 7 and described below. Notably, the tools may be part of one or more software programs stored in a memory and configured for execution by a central processing unit (CPU).

One or more aspects of the invention relate to creating dynamically reconfigurable modules for use in an FPGA. In particular, the logic design is divided into a top-level design having modules. Each of the modules is either a static module or a reconfigurable module. A reconfigurable module is capable of partial dynamic active reconfiguration when the target FPGA is active via a partial reconfiguration process. Once the target FPGA is active, a static module is fixed and cannot be reconfigured. For a modular design, the logic design system 300 is used to separately implement the modules and then the top-level design, as described more fully below. For purposes of clarity by example, the logic design system 300 is described immediately below with respect to a logic design in general. Features of the design system 300 specifically pertaining to modular design are described along with FIG. 4.

In particular, the logic capture tool 302 is configured to capture a circuit design from a user and generate a behavioral description 318 of the circuit design. The behavioral description 318 includes a plurality of circuit components, such as flip-flops, memories, LUTs, and the like, connected together via signal conductors (nets). The logic capture tool 302 may include a graphic interface through which a designer connects symbols and blocks representing various components to produce a schematic description of the circuit design. The logic capture tool 302 may also include a text interface through which a designer writes hardware description language (HDL) code to produce a structural and/or behavioral description of the circuit design in terms of HDL constructs. Examples of HDLs include the Very high-speed integrated circuit Hardware Description Language (VHDL) and VERILOG.

The synthesis tool 304 is configured to receive the behavioral description 318. The synthesis tool 304 processes the behavioral description 318 to produce a logical description 320 of the circuit design. The logical description 320 includes a logical network list ("netlist") of lower-level circuit elements and logic gates, as well as connections (nets) between inputs and outputs thereof, in terms of the hierarchy specified in the behavioral description 318. For example, the logical description 320 may be compliant with the Electronic Design Interchange Format (EDIF). The synthesis tool 304 may also generate constraint data associated with the logical description 320 that includes various timing and layout constraints. Alternatively, the logical description 320 may be annotated with constraint data. Such an annotated netlist is produced by XST synthesis tool, commercially availably by Xilinx, Inc., of San Jose, Calif.

The floorplanner 308 is configured to receive the logical description 320. The floorplanner 308 may comprise a graphical tool that gives a designer control over location of circuit components of a logic design in the target FPGA. In one embodiment, the floorplanner 308 displays a hierarchical representation of the logic design in a window of a graphic interface using hierarchy structure lines and colors to distinguish the different hierarchical levels. The window displays the floorplan of the target FPGA and allows the designer to draw rectangles into which the designer places logic from the hierarchy. The floorplanner 308 generates various constraints that are provided as part of constraint data 324. Such constraints include positions and ranges of logic blocks. A designer may use the constraint editor 310 to add various constraints to the constraint data 324, such as PERIOD constraints (i.e., the time between rising edges of a clock signal) for all clocks, as well as input/output (IO) timing constraints (time between two pins, typically measured from a clock input at a first pin and data out at a second pin) for IOs.

The map tool 312 is configured to receive the logical description 320 and the constraint data 324. The map tool 312 maps the logical description 320 onto physical resources within the target FPGA (i.e., the circuit components, logic gates, and signals are mapped onto LUTs, flip-flops, clock buffers, I/O pads, and the like of the target FPGA). The map tool 308 produces a mapped circuit description 326 in accordance with any constraints in the constraint data 324. The mapped circuit description 326 includes groupings of the physical resources of the target FPGA expressed in terms of CLBs and IOBs that include these resources.

The PAR tool 314 is configured to receive the mapped circuit description 326 and the constraint data 324. The PAR tool 314 determines placement for the physical resource groupings of the mapped circuit description 326 in the target FPGA and apportions the appropriate routing resources. The PAR tool 314 performs such placement and routing in accordance with any constraints in the constraint data 324. The PAR tool 314 produces physical design data 328. The bitstream generator 316 is configured to receive the physical design data 328 and produce bitstream data 330 for the target FPGA.

Figure 4:
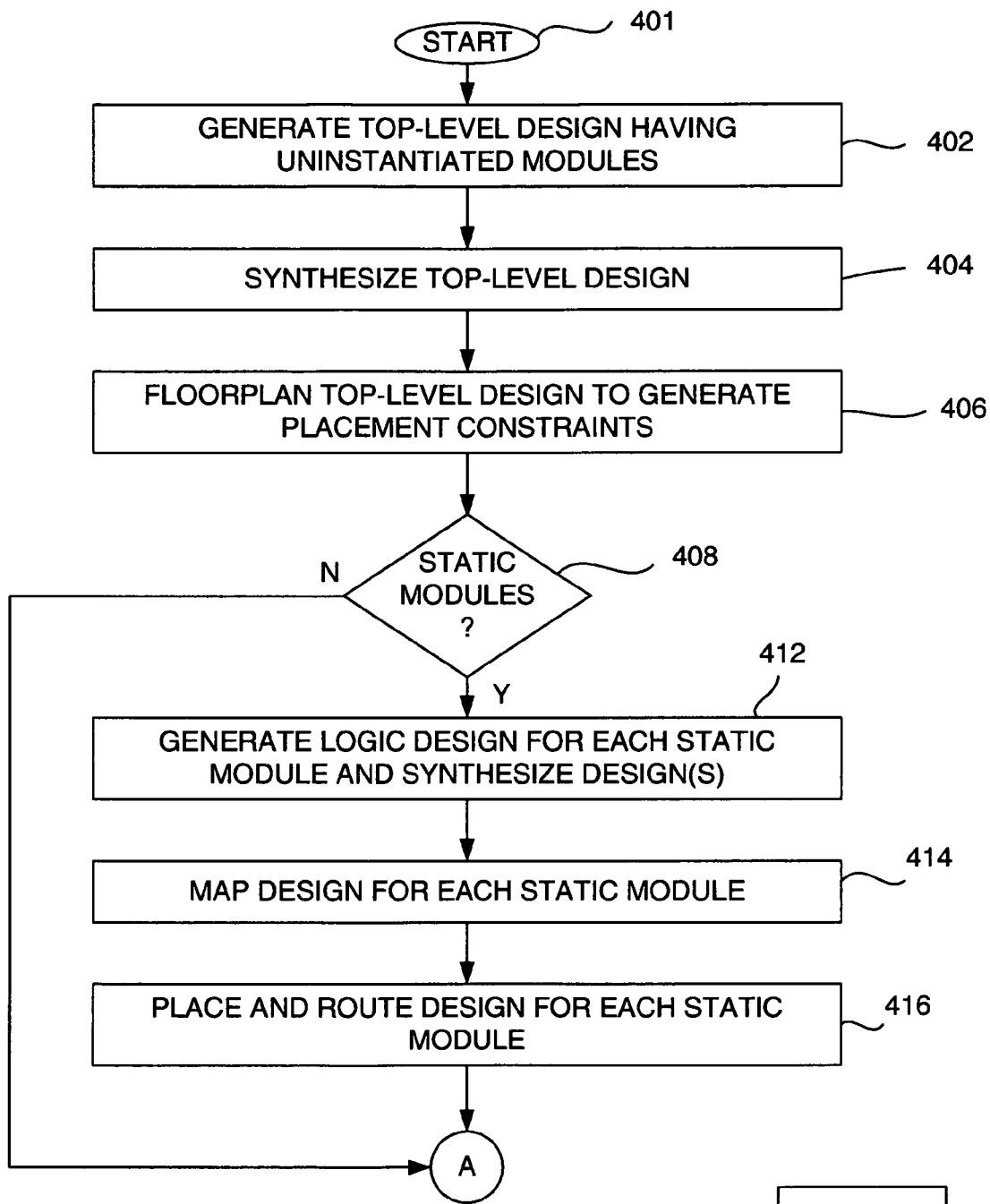
FIGS. 4-5 depict a flow diagram of an exemplary embodiment of a method for modular design in accordance with one or more aspects of the invention.
Figure 5:
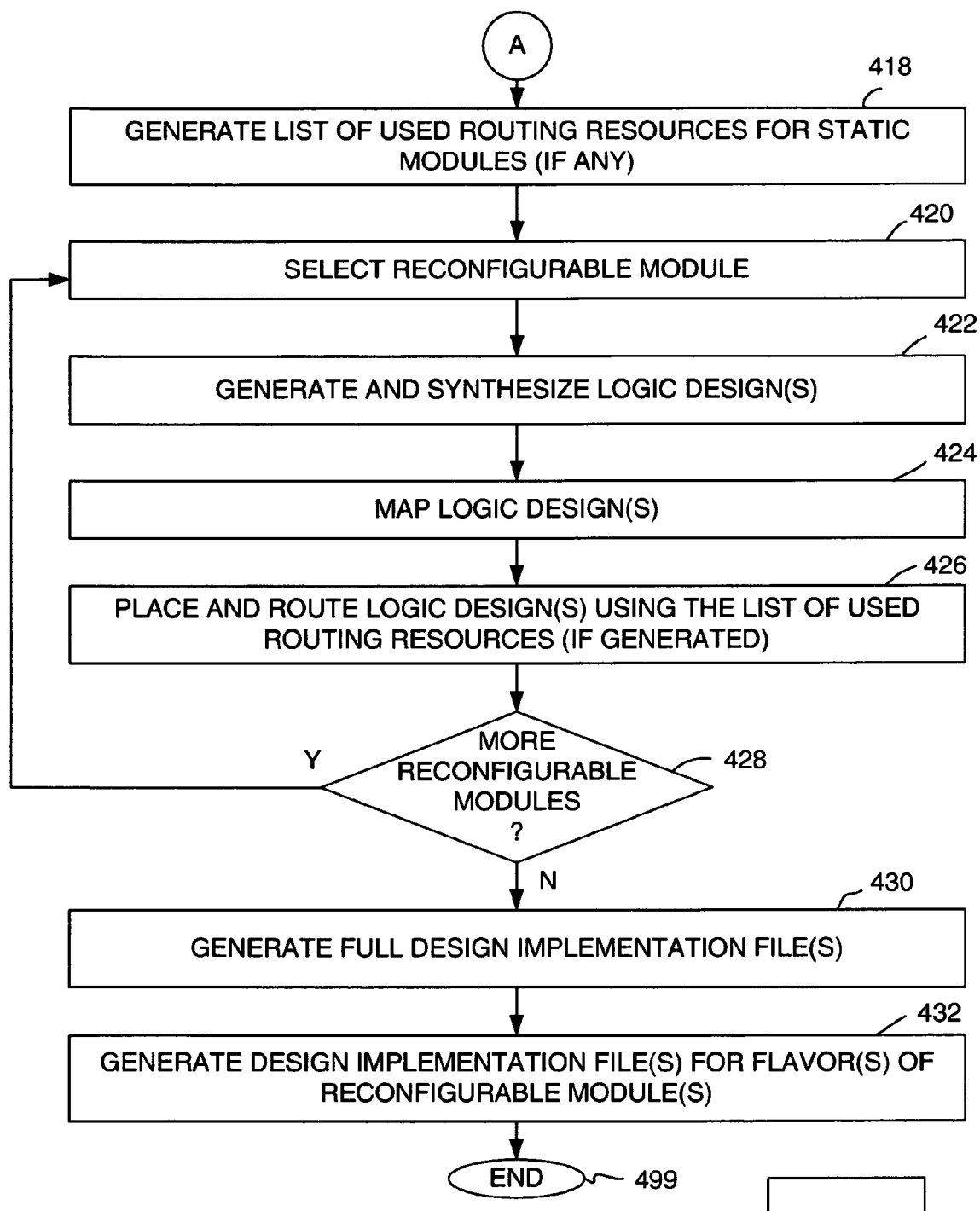

FIGS. 4-5 depict a flow diagram of an exemplary embodiment of a method 400 for modular design in accordance with one or more aspects of the invention. The method 400 begins at step 401. At step 402, a top-level design is captured using the logic capture tool 302. At step 404, the top-level design is synthesized using the synthesis tool 304. At step 406, the top-level design is floorplanned to generate placement constraints using the floorplanner 308 (or the floorplan may be generated manually by a designer). The placement constraints are part of the constraint data for the top-level design, which may include other constraints, such as timing constraints. Steps 402 through 406 are referred to as the "initial budgeting phase." In particular, the top-level design includes a plurality of un-instantiated modules, a signal interface for each module, global resources and signals (e.g., IOB resources, clock signals), and one or more logic interface macros. Each un-instantiated module includes a defined signal interface and may be configured as either a static module or a reconfigurable module. The signal interface of each module may include one or more ports and signals associated with the ports.

For a static module, the signal interface is unrestricted in that all signals connecting to/from a static module are connected directly to the ports of the module. A static module may interface with IOBs. In accordance with one aspect of the invention, defining an implementation area within the floorplan is optional for each static module. By not constraining the area of a static module, complexity of the design layout is reduced. For example, the designer is not required to explicitly lock a static module into an arbitrary rectangular area, which may otherwise cause sub-optimal logic placement. However, a static module cannot overlap an implementation area of any reconfigurable module. As discussed below, a static module will have a single physical implementation.

For a reconfigurable module, the signal interface is restricted in that each signal connecting to/from the reconfigurable module is connected to a pin (i.e., logical connection) on a logic interface macro. Signals that are to be connected to IOBs must be connected to a pin of a logic interface macro, which is then connected to the IOB in the top level design. Each reconfigurable module defines a single rectangular implementation area in the floorplan. A reconfigurable module will have multiple "implementation flavors", as discussed below.

A logic interface macro comprises a set of programmable logic in the target FPGA. In one embodiment, a logic interface macro includes a predefined set of CLB slices along with associated routing resources. The defined routing resources for each logic interface macro define the direction and number of signals which flow "across" this macro (e.g., from one side of the macro to the other). Each logic interface macro is located in the floorplan such that half of its pins fall within a single reconfigurable module implementation area, while the other half of its pins fall outside of any reconfigurable module implementation areas. All ports of a reconfigurable module must connect only with the logic interface macro pins that fall within its boundaries. All signals connecting to/from a reconfigurable module must connect to the appropriate logic interface macro pins that lie outside of all reconfigurable module implementation areas. The routing resources that are part of the logic interface macro define an exact routing path across the boundary between two implementation areas, which guarantees that the routing interface between static and dynamic regions is fixed. Note that the purpose of the logic interface macro is to lock in a specific routing resource to be utilized for communication with dynamic portions of the design. Any form of interface that has this effect may be utilized. For example, a logic interface macro may be a specific routing resource that crosses the boundary to be used without any logic.

The use of logic interface macros, as opposed to conventional three-state buffer (tbuf) macros, significantly increases the number of interface signals available to a given reconfigurable module (i.e., tbufs are often a scarce resource in an FPGA). In addition, use of logic interface macros significantly expands the timing constraints that can be applied to a given design, as well as provides the ability to generate post-implementation timing data to more fully analyze the operation of a design. Notably, with conventional tbuf macros, the most complex timing constraint a designer can specify between tbufs is a point-to-point constraint (e.g., FROM:TO MAXDELAY). However, with programmable logic (CLB slices, registers) of a logic interface macro, a designer can specify PERIOD/FREQUENCY constraints on time groups of register slices, as well as OFFSET IN/OUT constraints. PERIOD constraints allow a designer to easily relate an analyze cross-clock domain paths, accounting for clock phase relationships. They also automatically account for clock skew and uncertainty (due to input, system, and DCM jitter and phase error). Simple tbuf FROM:TO constraints do not achieve these advantages. Finally the use of logic interface macros allows for the inclusion of circuitry within these macros to disable their signal outputs when a module is reconfigured so that erratic or bogus information is not present to other portions of the design.

In accordance with one aspect of the invention, the defined area for a reconfigurable module need not include all logic cells (CLBs, IOBs, etc.) in the full height of a column in the target device. Logic cells above and below any reconfigurable module implementation area may be used by static modules of the design. Use of such logic cells can enhance the operation characteristics of any design through minimization of critical net routing delays.

Notably, certain types of logic, referred to as "glitchable logic," are not allowed to be placed within the same bit frame of any reconfigurable module. "Glitchable" means that the programming of the same value into a memory cell will not go unnoticed to the executing logic. In current FPGA devices, this is equivalent to not allowing glitchable logic to be placed above or below any reconfigurable module implementation area. Glitchable logic is target device specific and includes, for example, LUT-RAMs, BRAMs, shift-registers, and like type logic elements. Note that some devices are glitchable by implementation. This is generally caused by the partial reconfiguration hardware implementation for the device. An example would be an implementation where the hardware clears all the frame bits before loading the new one. For architectures of this type, it is necessary to disallow the non reconfigurable portion (static portion) of the design from existing in any bit frame associated with the areas defined for partial reconfiguration. Note that, in some designs, the design is temporarily suspended during re-configuration. In such a case, the aspect of whether the resources glitch does not matter and, as such, the designer does not have to account for the above restrictions.

Figure 6:
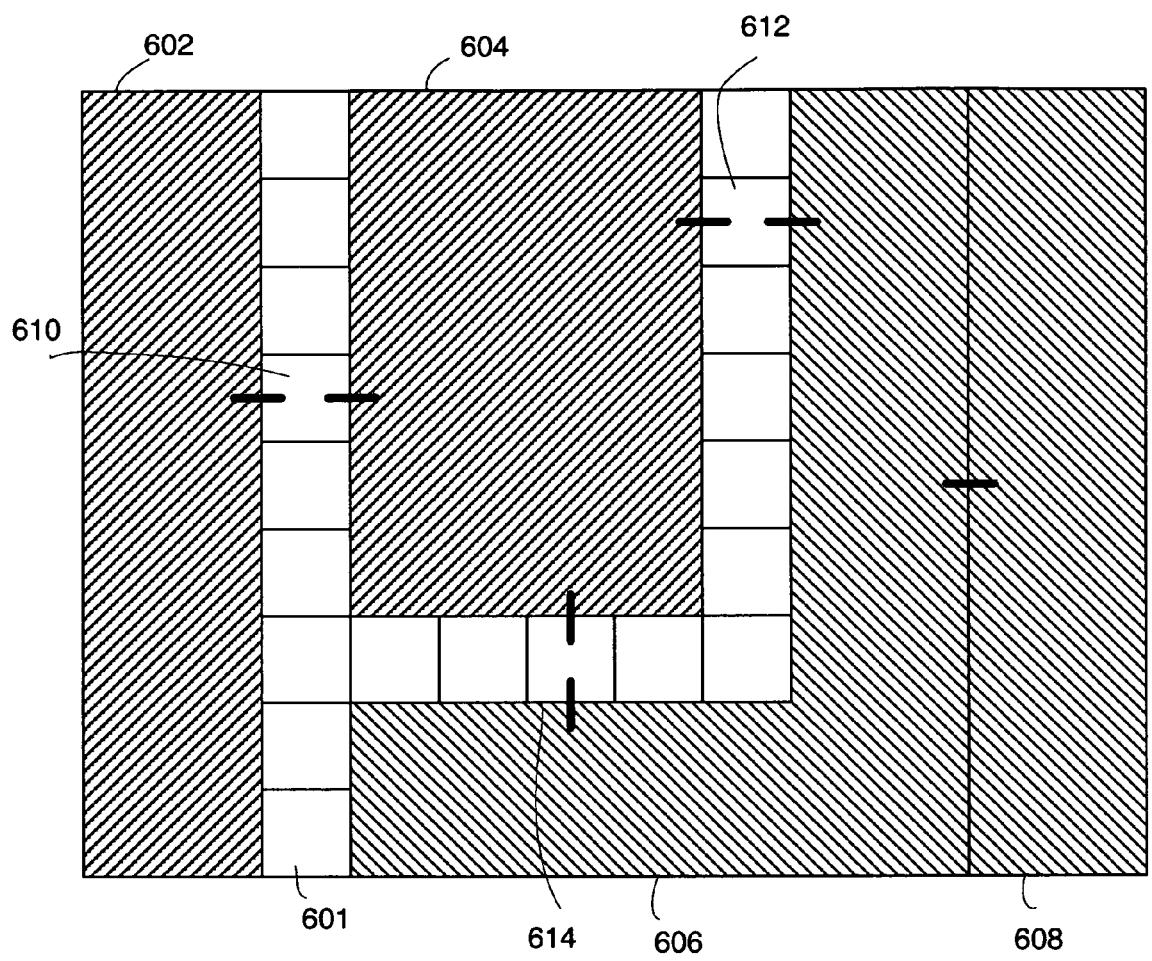
FIG. 6 is a block diagram depicting an exemplary top-level floorplan in accordance with one or more aspects of the invention.

FIG. 6 is a block diagram depicting an exemplary top-level floorplan 600 in accordance with one or more aspects of the invention. In FIG. 6, the blocks 601 generally represent logic cells in the target FPGA device. The top-level floorplan 600 illustratively includes a reconfigurable module 602, a reconfigurable module 604, a static module 606, and a static module 608. The reconfigurable module 602 extends the full height of the device and is configured for communication with the reconfigurable module 604 via a logic interface macro 610, which illustratively comprises a single logic cell. The reconfigurable module 604 does not extend the full height of the device. The cells below the reconfigurable module 604 are used by the static module 606. The reconfigurable module 604 is configured for communication with the static module 606 via a logic interface macro 614 and a logic interface macro 612. The static module 608 extends the full height of the device and is configured for direct communication with the static module 606.

Returning to FIGS. 4 and 5, after the initial budgeting phase, the method 400 proceeds to the active module phase, where the un-instantiated modules in the top-level design are physically implemented. At step 408, a determination is made whether the top-level design includes any un-instantiated static modules. If so, the method 400 proceeds to step 412, where a logic design for each static module is generated and synthesized using the logic capture tool 302 and the synthesis tool 304, respectively. At step 414, the logic design for each static module is mapped onto physical resources in the target FPGA using the map tool 312 in accordance with the constraint data of the top-level design and any constraint data for the module design. At step 416, the logic design for each static module is placed and routed using the PAR tool 314 in accordance with the constraint data of the top-level design and any constraint data for the module design. Notably, in accordance with one aspect of the invention, signals for a static module can be routed by the PAR tool 314 through any reconfigurable implementation area. This allows for more optimal routing of the static modules in that such modules are not constrained to fully exist within defined regions of the device. The method 400 then proceeds to step 418.

If, at step 408, there are no static modules in the top-level design, the method 400 proceeds directly to step 418. At step 418, a list of used routing resources is generated for any static modules. In one embodiment, the list includes two types of routing resources. A first are those used routing resources that have configuration bits falling within the defined implementation area of any reconfigurable module. A second type are those routing resources having configuration bits falling within the defined implementation area of any reconfigurable module whose use in a reconfigurable module would cause an electrical short.

Notably, if a static module includes routing resources in a reconfigurable implementation area, the static design implementation must be "aware" of any reconfigurable design implementation and vice versa. Since the static design and dynamic design both may utilize resources in the dynamic areas, each must be aware of the other so that they do not create shorts (i.e., utilize the same routing resources) in the dynamic area. The awareness is achieved through the list of used routing resources. While this restriction disallows parallel implementation of static and dynamic modules, the advantage of more optimal routing of the static modules may outweigh this restriction. In another embodiment, if a designer may determine that the static portion of the design will not benefit from using routing resources in the reconfigurable area and thus the static and reconfigurable modules may be implemented in parallel. In such an embodiment, the list of used routing resources need not be generated at step 418 (i.e., step 418 may be skipped).

At step 420, a reconfigurable module is selected. At step 422, at least one logic design for the selected reconfigurable module is generated and synthesized using the logic capture tool 302 and the synthesis tool 304, respectively. Each design for the selected reconfigurable module is referred to as a "flavor" for the module. At step 424, each logic design is mapped onto physical resources in the target FPGA using the map tool 312 in accordance with the constraint data of the top-level design and any constraint data for the module design. At step 426, each logic design is placed and routed using the PAR tool 314 in accordance with the constraint data of the top-level design, any constraint data for the module design, and the list of used routing resources created at step 418. Notably, the PAR tool 314 uses the list of used routing resources to prohibit the implementation of any reconfigurable module flavor from using any of the routing resources specified in the list. At step 428, a determination is made whether the top-level design includes more reconfigurable modules. If so, the method 400 returns to step 420 and repeats. Otherwise, the method 400 proceeds to step 430.

After the active module phase, the method 400 proceeds to the final assembly phase, where physical implementations of the modules are combined to produce a complete physical design. At step 430, at least one full design implementation file is generated by combining the static modules with various flavors of the reconfigurable modules. For example, if a design has two static modules (S1, S2) and two reconfigurable modules, each of which has two flavors (R1.1, R1.2, R2.1, and R2.2), then there are four possible full design implementations:

a) both S1 and S2 with R1.1 and R2.1;

b) both S1 and S2 with R1.1 and R2.2;

c) both S1 and S2 with R1.2 and R2.1; and d) both S1 and S2 with R1.2 and R2.2.

One or more of these full design implementations may be produced at step 430. In particular, a full design implementation file may be produced by mapping, placing, routing, and generating a bitstream for the top-level design and the modules using the map tool 312, the PAR tool 314, and the bitstream generator 316. The implementations for the modules in the active implementation phase are preserved. The resultant bitstream(s) are full device programming files.

At step 432, a single design implementation file is produced for at least one flavor of at least one reconfigurable module. These design implementations differ from those generated during the active implementation phase in that all of the resources from the static modules are included. In the above example, four implementation files are generated:

a) implementation file for flavor 1 of reconfigurable module 1 with S1 and S2;

b) implementation file for flavor 2 of reconfigurable module 1 with S1 and S2;

c) implementation file for flavor 1 of reconfigurable module 2 with S1 and S2; and d) implementation file for flavor 2 of reconfigurable module 2 with S1 and S2.

One or more of these partial design implementations may be produced at step 432. The partial design implementations are produced by mapping, placing, routing, and generating a bitstream for the top-level design and the modules using the map tool 312, the PAR tool 314, and the bitstream generator 316. The implementations for the modules in the active implementation phase are preserved. The resultant bitstream(s) are partial device programming files and can only be used to reconfigure or dynamically change the functional behavior of a given reconfigurable module to the associated module flavor. This reconfiguration of a given reconfigurable module can take place while the rest of the device, as defined in the static modules and the reconfigurable modules not being updated, continue to operate in a glitchless manner. The method 400 ends at step 499.

In the above embodiment, the static design and the dynamic design are merged together to generate a single bit stream that can be programmed into the device without considering what the bitstream is programming over. It is possible, in some devices, to dynamically read back what is currently programmed in the configuration frames and to "add" to the programming to the existing programming. Utilizing this method of programming removes the requirement that the static and dynamic designs be merged together in order to generate a bitstream, but requires extra programming support.

Figure 7:
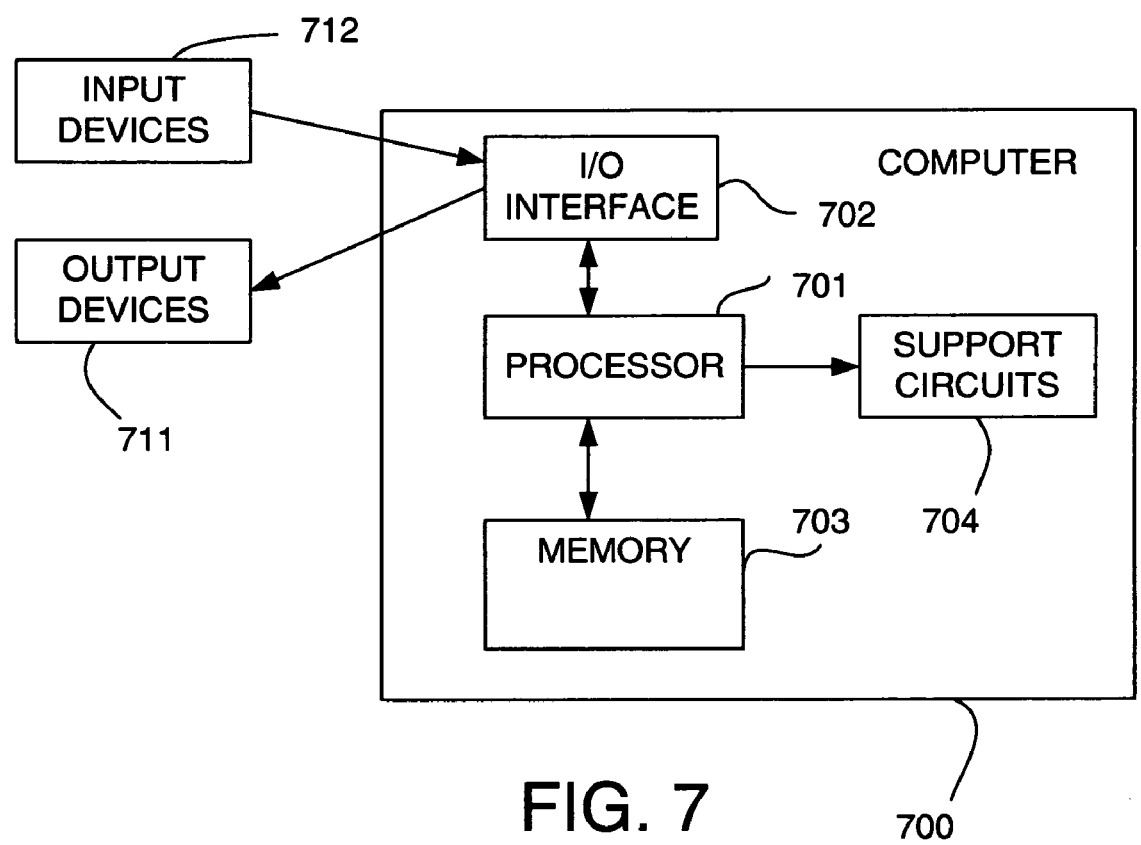
FIG. 7 is a block diagram depicting an exemplary embodiment of a computer suitable for implementing the processes and methods described herein.

FIG. 7 is a block diagram depicting an exemplary embodiment of a computer 700 suitable for implementing the processes and methods described herein. For example, the computer 700 may be used to implement the system 200 of FIG. 2, as well as the method 400 of FIGS. 4-5. The computer 700 includes a processor 701, a memory 703, various support circuits 704, and an I/O interface 702. The processor 701 may be any type of microprocessor known in the art. The support circuits 704 for the processor 701 include conventional cache, power supplies, clock circuits, data registers, I/O interfaces, and the like. The I/O interface 702 may be directly coupled to the memory 703 or coupled through the processor 701. The I/O interface 702 may be coupled to various input devices 712 and output devices 711, such as a conventional keyboard, mouse, printer, display, and the like.

The memory 703 stores all or portions of one or more programs and/or data to implement the system 200 and the method 400 described herein. Although one or more aspects of the invention are disclosed as being implemented as a computer executing a software program, those skilled in the art will appreciate that the invention may be implemented in hardware, software, or a combination of hardware and software. Such implementations may include a number of processors independently executing various programs and dedicated hardware, such as ASICs.

The computer 700 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in the memory 703. The memory 703 may include one or more of the following random access memory, read only memory, magneto-resistive read/write memory, optical read/write memory, cache memory, magnetic read/write memory, and the like, as well as signal-bearing media as described below.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. A method of modular circuit design for an integrated circuit (IC), comprising:
    capturing a circuit design having plurality of modules and one or more logic interface macros positioned on a floorplan, each of the plurality of modules being one of a static module or a reconfigurable module, each of the one or more logic interface macros:
        being positioned at a boundary between a module pair of the plurality of modules; and
        comprising one or more configurable logic block (CLB) slices having a plurality of pins, a first half of the plurality of pins being located within a first module of the module pair and coupled only to ports of the first module, and a second half of the plurality of pins being located within a second module of the module pair and coupled only to ports of the second module;
    implementing each of the plurality of modules using information generated from the capturing step; and
    assembling the plurality of modules using the information generated from the capturing step and information generated from the implementing step.

2. The method of claim 1, wherein each of the one or more logic interface macros comprises at least one routing resource of the IC.

3. The method of claim 1, wherein the plurality of modules includes at least one reconfigurable module having a defined area in the floorplan that is less than a full height of the IC.

4. The method of claim 3, wherein the plurality of modules includes at least one static module, the at least one static module being positioned an unused area in the floorplan above or below the defined area.

5. The method of claim 1, wherein the step of implementing comprises:
    implementing each static module of the plurality of modules using at least one routing resource in a reconfigurable area of the floorplan;
    recording the at least one routing resource in a list of used routing resources; and
    implementing each reconfigurable module of the plurality of modules using the list of used routing resources.

6. The method of claim 1, wherein the step of implementing comprises:
    mapping each of the plurality of modules onto physical resources in the IC; and
    placing and routing each of the plurality of modules.

7. The method of claim 1, wherein the step of assembling comprises:
    combining the plurality of modules to produce at least one full design implementation file; and
    generating at least one design implementation file for at least one flavor of each reconfigurable module of the plurality of modules.

8. The method of claim 7, wherein each of the at least one full design implementation file comprises each static module and a flavor of each reconfigurable module of the plurality of modules.

9. The method of claim 7, wherein each of the at least one design implementation file comprises each static module and a flavor of a single reconfigurable module of the plurality of modules.

10. A system for modular circuit design for an integrated circuit (IC), comprising:
    a logic capture tool for capturing a circuit design having plurality of modules, each of the plurality of modules being one of a static module or a reconfigurable module;
    a floorplan tool for positioning the plurality of modules and positioning one or more logic interface macros on a floorplan, each of the one or more logic interface macros:
        being positioned at a boundary between a module pair of the plurality of modules; and
        comprising one or more configurable logic block (CLB) slices having a plurality of pins, a first half of the plurality of pins being located within a first module of the module pair and coupled only to ports of the first module, and a second half of the plurality of pins being located within a second module of the module pair and coupled only to ports of the second module;
    an implementation tool for implementing each of the plurality of modules and assembling the plurality of modules using information generated from the logic capture tool and the floorplan tool.

11. The system of claim 10, wherein each of the one or more logic interface macros comprises at least one routing resource of the IC.

12. The system of claim 10, further comprising:
    a synthesis tool for synthesizing the circuit design.

13. The system of claim 10, wherein the implementation tool comprises:
    a map tool for mapping each of the plurality of modules onto physical resources of the IC;
    a place and route tool for placing and routing each of the plurality of modules; and
    a bitstream generator for generating at least one implementation file for the circuit design.

14. The system of claim 13, wherein the place and route tool is configured to place and route at least one static module of the plurality of modules using at least one routing resource in a reconfigurable area of the floorplan and to record the at least one routing resource in a list of used routing resources.

15. The system of claim 14, wherein the place and route tool is configured to place and route at least one reconfigurable module of the plurality of modules in the reconfigurable area using the list of used routing resources.

16. The system of claim 13, wherein the at least one implementation file comprises at least one full design implementation file and at least one design implementation file, each of the at least one full design implementation file comprising each static module and a flavor of each reconfigurable module of the plurality of modules, each of the at least one design implementation file comprising each static module and a flavor of a single reconfigurable module of the plurality of modules.

17. The system of claim 10, wherein the information generated from the logic capture tool and the floorplan tool comprises constraint data.

18. A computer readable medium having stored thereon software for modular circuit design for an integrated circuit (IC), the software comprising:
    code for capturing a circuit design having plurality of modules and one or more logic interface macros positioned on a floorplan, each of the plurality of modules being one of a static module or a reconfigurable module, each of the one or more logic interface macros:
        being positioned at a boundary between a module pair of the plurality of modules; and
        comprising one or more configurable logic block (CLB) slices having a plurality of pins, a first half of the plurality of pins being located within a first module of the module pair and coupled only to ports of the first module, and a second half of the plurality of pins being located within a second module of the module pair and coupled only to ports of the second module;
    code for implementing each of the plurality of modules using information generated from the code for capturing; and
    code for assembling the plurality of modules using the information generated from the code for capturing and information generated from the code for implementing.

* * * * *